(12) United States Patent
Pesl et al.

(10) Patent No.: US 9,347,979 B2
(45) Date of Patent: May 24, 2016

(54) TOUCHDOWN MONITORING FOR INDIVIDUAL DIES OF A SEMICONDUCTOR WAFER

(71) Applicant: Infineon Technologies AG, Neubiberg (DE)

(72) Inventors: Stefan Pesl, Regensburg (DE); Robert Schütz, Forchheim (DE)

(73) Assignee: Infineon Technologies AG, Neubiberg (DE)

( * ) Notice: Subject to any disclaimer, the term of this patent is extended or adjusted under 35 U.S.C. 154(b) by 270 days.

(21) Appl. No.: 14/042,824

(22) Filed: Oct. 1, 2013

(65) Prior Publication Data

US 2015/0091595 A1    Apr. 2, 2015

(51) Int. Cl.
| | | |
|---|---|---|
| *G01R 31/26* | (2014.01) | |
| *G01R 31/00* | (2006.01) | |
| *G01R 31/28* | (2006.01) | |
| G01R 1/067 | (2006.01) | |

(52) U.S. Cl.
CPC ........ *G01R 31/2601* (2013.01); *G01R 31/2887* (2013.01); *G01R 1/06794* (2013.01); *G01R 31/2894* (2013.01)

(58) Field of Classification Search
CPC ........... G01R 1/07342; G01R 1/06738; G01R 1/07378; G01R 1/06772; G01R 1/06727; G01R 31/2886; G01R 1/06711; G01R 31/2894; G01R 31/2891; G01R 31/2887; G01R 1/0491; G01R 31/2889; G01R 31/318572; G01R 1/0408; G01R 35/005; G01R 31/2601; G11C 29/56; G11C 29/56008
See application file for complete search history.

(56) References Cited

U.S. PATENT DOCUMENTS

| | | | | |
|---|---|---|---|---|
| 5,644,245 | A * | 7/1997 | Saitoh ................ | G01R 1/06794 324/750.18 |
| 7,330,025 | B1 * | 2/2008 | Beach ................ | G01R 31/2893 324/762.02 |
| 7,839,156 | B2 * | 11/2010 | Yamada ............. | G01R 31/2891 324/750.25 |
| 2010/0213960 | A1 * | 8/2010 | Mok ...................... | G01R 35/00 324/762.03 |

FOREIGN PATENT DOCUMENTS

KR    20100073584    *    7/2010    ............. H01L 21/66

* cited by examiner

*Primary Examiner* — Vinh Nguyen
(74) *Attorney, Agent, or Firm* — Murphy, Bilak & Homiller, PLLC

(57) ABSTRACT

A prober system comprises a chuck, sensor and processing circuit. The chuck is configured to horizontally move a semiconductor wafer having a plurality of dies to position a selected group of the dies for parallel testing and vertically move the wafer to press the selected group of dies in contact with probes of a tester probe card. The sensor is configured to measure the vertical movement of the chuck when the wafer is on the chuck. The processing circuit is configured to control the horizontal and vertical movement of the chuck to test different groups of the dies, determine a total number of touchdowns between the wafer and the probes based on the vertical movement of the chuck measured by the sensor and associate each of the touchdowns with a location of the wafer contacted by the probes during that touchdown. A corresponding test data analysis system is also provided.

25 Claims, 8 Drawing Sheets

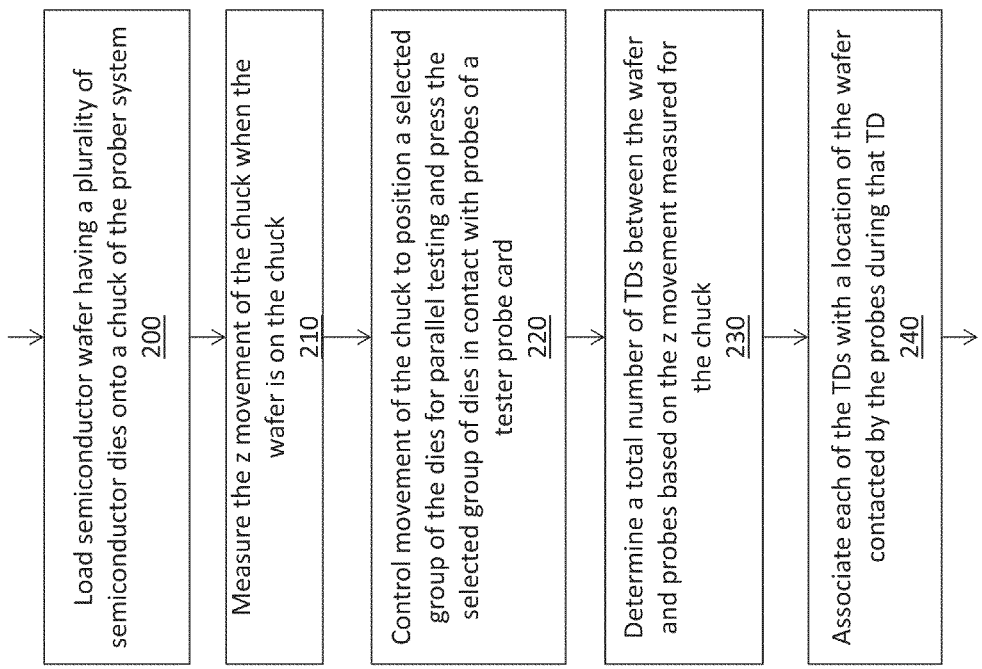

TOUCHDOWN MONITORING FOR INDIVIDUAL DIES OF A SEMICONDUCTOR WAFER

TECHNICAL FIELD

The present application relates to testing of semiconductor wafers, in particular monitoring the number of touchdowns for individual dies of a semiconductor wafer.

BACKGROUND

In the wafer test area, the functionality of the semiconductor dies on the wafer is tested. To execute these tests, physical contact is established between the dies on the wafer and the test equipment. The test equipment typically includes a test system for administering the tests and collecting the test results through a probe card. The probe card includes probes for contacting each die to be tested. Each physical contact between the probes of a probe card (or any other contact technology) and the pads of the dies being tested is commonly referred to as a touchdown (TD) in the semiconductor testing industry. As the number of TDs increases, so too does the risk of pad cracks or other pad damage or problems such as decreased bondability, etc. The actual number of TDs experienced by individual semiconductor dies is conventionally unknown. As such, conventional semiconductor die testing techniques are unable to detect and scrap dies which have been contacted too often and therefore have a higher quality risk or do not meet customer requirements regarding TD count. Conventional testing techniques instead estimate TD count based on the amount of tests and only for the entire wafer, not for single dies.

SUMMARY

According to an embodiment of a prober system, the prober system comprises a chuck, sensor and processing circuit. The chuck is configured to horizontally move a semiconductor wafer having a plurality of semiconductor dies to position a selected group of the dies for parallel testing and vertically move the wafer to press the selected group of dies in contact with probes of a tester probe card. The sensor is configured to measure the vertical movement of the chuck when the wafer is on the chuck. The processing circuit is configured to control the horizontal and vertical movement of the chuck to test different groups of the dies, determine a total number of touchdowns between the wafer and the probes based on the vertical movement of the chuck measured by the sensor and associate each of the touchdowns with a location of the wafer contacted by the probes during that touchdown.

According to an embodiment of a method of counting wafer touchdowns at a prober system, the method comprises: loading a semiconductor wafer having a plurality of semiconductor dies onto a chuck of the prober system; controlling horizontal movement of the chuck to position a selected group of the dies for parallel testing and vertical movement of the chuck to press the selected group of dies in contact with probes of a tester probe card; measuring the vertical movement of the chuck when the wafer is on the chuck; determining a total number of touchdowns between the wafer and the probes based on the vertical movement measured for the chuck; and associating each of the touchdowns with a location of the wafer contacted by the probes during that touchdown.

According to an embodiment of a test data analysis system, the test data analysis system comprises an input/output (I/O) interface and a processing circuit. The I/O interface is configured to retrieve tester data and prober data for a semiconductor wafer having a plurality of semiconductor dies. The tester data includes test data collected for the wafer by one or more testers having a probe card for contacting the wafer. The prober data includes a total number of touchdowns between the wafer and each probe card that tested the wafer and a location of the wafer contacted by one of the probe cards during each of the touchdowns. The processing circuit is configured to determine a total number of touchdowns for each of the dies based on the total number of touchdowns for the wafer and the location of the wafer contacted by one of the probe cards during each of the touchdowns. The processing circuit is further configured to compare the total number of touchdowns determined for each of the dies to a maximum touchdown limit to determine whether any of the dies exceeds the maximum touchdown limit.

According to an embodiment of a method of analyzing test data, the method comprises: retrieving tester data and prober data for a semiconductor wafer having a plurality of semiconductor dies, the tester data including test data collected for the wafer by one or more testers having a probe card for contacting the wafer, the prober data including a total number of touchdowns between the wafer and each probe card that tested the wafer and a location of the wafer contacted by one of the probe cards during each of the touchdowns; determining a total number of touchdowns for each of the dies based on the total number of touchdowns for the wafer and the location of the wafer contacted by one of the probe cards during each of the touchdowns; and comparing the total number of touchdowns determined for each of the dies to a maximum touchdown limit to determine whether any of the dies exceeds the maximum touchdown limit.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2 illustrates a flow diagram of an embodiment of a method of counting wafer touchdowns at the prober system of FIG. 1.

DETAILED DESCRIPTION

The embodiments described herein provide an apparatus and method for detecting the number of actual TDs (touchdowns) each die on a semiconductor wafer experiences during the wafer testing process. This per-die TD count information can be used to screen dies based on a maximum TD limit, so that dies which exceed the maximum TD limit can be identified and scrapped or at least separated from those dies which do not exceed the maximum TD limit.

Figure 1:
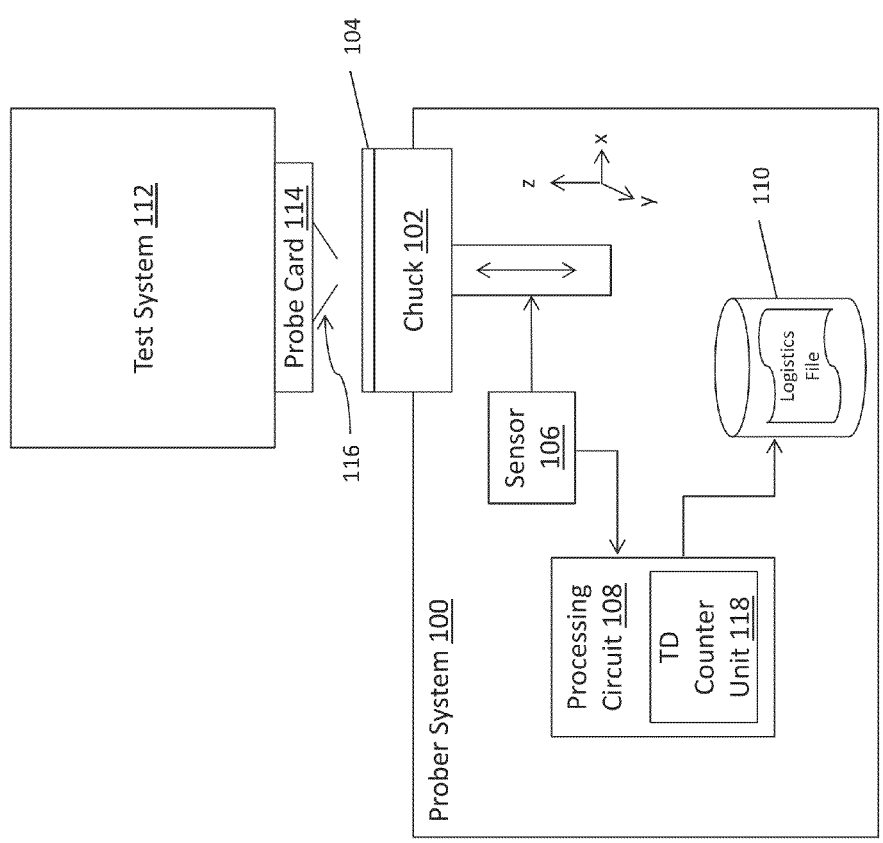
FIG. 1 illustrates a schematic block diagram of an embodiment of a prober system.

FIG. 1 illustrates an embodiment of a prober system 100 comprising a chuck 102 for receiving a semiconductor wafer 104 having a plurality of semiconductor dies, a sensor 106, a processing circuit 108, and data storage 110 such as a HDD (hard disk drive), tape drive and/or optical drive. Operation of the prober system 100 is explained next with reference to FIG. 2, which illustrates an embodiment of a method of counting wafer touchdowns at the prober system 100.

The semiconductor wafer 104 is loaded on the chuck 102 in preparation for testing of the wafer 104 (Step 200). The chuck 102 is configured to horizontally move the wafer 104 in the x and/or y direction to position a selected group of the dies for parallel testing by a test system 112. The test system 112 administers tests and collects the corresponding test results through a probe card 114. The probe card 114 includes probes 116 for contacting each die to be tested. The probe card 114 can contact a single die or multiple dies at the same time, so that one or more dies can be tested in parallel. Any standard test system and probe card can be used, so no further explanation is given in this regard.

The chuck 102 is also configured to vertically move the wafer 104 in the z direction to press the selected group of dies in contact with the probes 116 of the tester probe card 114. Contact is made between the probes 116 of the probe card 114 and the pads of the dies aligned with the probe card 114 each time the chuck 102 presses the wafer 104 in contact with the probes 116 in the z direction. Each instance of contact between the probes 116 and the wafer 104 is referred to herein as a touchdown or TD. The sensor 106 included in the prober system 100 is configured to measure the vertical movement of the chuck 102 when the wafer 104 is on the chuck 102 (Step 210). TDs may occur under various conditions such as during automatic test runs, during manual intervention by an operator, during the configuration or adjustment of the probe height (so-called contact loop), etc. The sensor 106 detects the vertical movement of the chuck 102 during these and other conditions when the wafer 104 is on the chuck 102, and provides this information to the processing circuit 108. Any standard vertical movement sensor can be used, so no further explanation is given in this regard.

The processing circuit 108 is configured to control the horizontal and vertical movement of the chuck 102 in order to position different groups of the dies for testing by the test system 112 (Step 220). This includes horizontal (x-y) movement of the wafer 104 to position a selected group of the dies for parallel testing by the test system 112, and vertical (z) movement of the wafer 104 to press the selected group of dies in contact with the probes 116 of the tester probe card 114.

The processing circuit 108 is also configured to process the vertical movement data measured by the sensor 106 for the chuck 102 to generate TD count information for the wafer 104. The processing circuit 108 can include digital and/or analog circuitry such as one or more controllers, processors, ASICs (application-specific integrated circuits), etc. for executing program code which performs the TD count operations described herein. To this end, the prober system 100 includes a TD counter unit 118 included in or associated with the processing circuit 108 for performing the TD count operations.

The TD counter unit 118 determines the total number of TDs between the wafer 104 and the probes 116 based on the vertical movement data measured by the sensor 106 for the chuck 102 (Step 230). The TD counter unit 118 also associates each of the TDs with a location of the wafer 104 contacted by the probes 116 during that TD (Step 240).

In one embodiment, the TD counter unit 118 determines the total number of TDs between the wafer 104 and the probes 116 by comparing the vertical movement measurement data from the sensor 106 for the chuck 102 to a threshold value and determining that a TD occurred between the wafer 104 and the probes 116 each time the vertical movement measurement data exceeds the threshold value. As long as the z-position measured for the chuck 102 remains above the threshold value, the TD counter unit 118 counts this occurrence as a single TD for the wafer 104. The TD is finalized when the z-position of the chuck 102 drops below the threshold value.

The threshold value corresponds to a contact height value assigned to the probes 116 plus an adjustment value which accounts for height differences between the probes 116, because usually the probes 116 contact the die pads before the contact height is reached. Before the contact loop (i.e. before configuration or adjustment of the probe height), the contact height is based on the outcome of a probe alignment process. After the contact loop, the contact height detected by the contact loop is used. The adjustment value can be a positive or negative value. In one embodiment, the adjustment value ranges between −99 μm and +99 μm. The adjustment value can be implemented as an actual height value or a delta to the contact height.

Figure 3A:
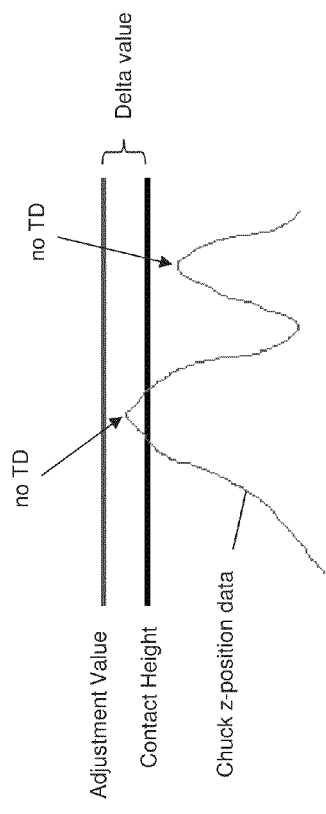
FIGS. 3A and 3B illustrate respective diagrams of an embodiment of determining wafer touchdowns using a positive probe height adjustment value.
Figure 3B:
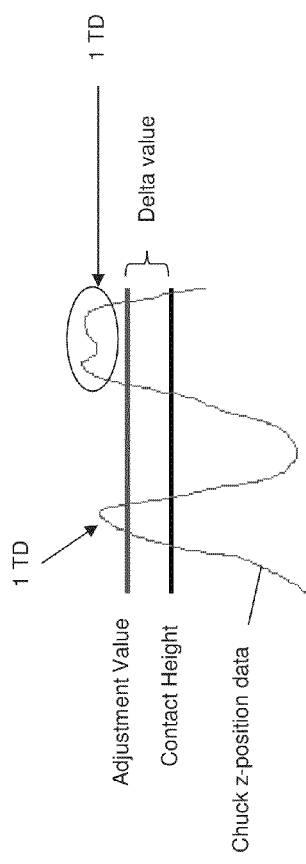

FIGS. 3A and 3B illustrate different TD count outcomes based on a positive adjustment value. In these cases, the z-position measured for the chuck 102 must exceed the contact height by the positive adjustment value for the TD counter unit 118 to register a TD count event for the wafer 104. In FIG. 3A, the z-position measured for the chuck 102 exceeds the contact height for a brief moment but does not exceed the positive adjustment value and therefore no TD count is registered. In FIG. 3B, the z-position measured for the chuck 102 exceeds the contact height plus the positive adjustment value and then drops below the contact height. The TD counter unit 118 registers this event as a single TD for the wafer 104. The z-position measured for the chuck 102 again rises above the contact height plus the positive adjustment value, dips somewhat while remaining above the adjustment value, and then eventually drops below the contact height. The TD counter unit 118 registers this subsequent event as another single TD for the wafer 104. As such, two TDs are registered for the wafer 104 during the observation time window shown in FIG. 3B whereas no TDs are registered during the observation time window shown in FIG. 3A.

Figure 4A:
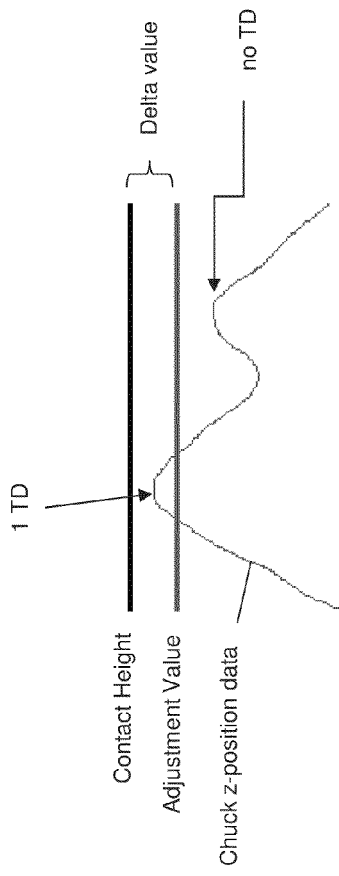
FIGS. 4A and 4B illustrate respective diagrams of an embodiment of determining wafer touchdowns using a negative probe height adjustment value.
Figure 4B:
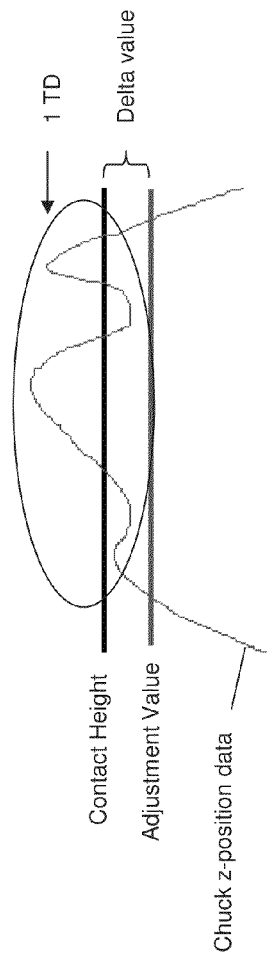

FIGS. 4A and 4B illustrate different TD count outcomes based on a negative adjustment value. In these cases, the z-position measured for the chuck 102 must exceed the contact height less the negative adjustment value in order for the TD counter unit 118 to register a TD count event for the wafer 104. In FIG. 4A, the z-position measured for the chuck 102 exceeds the contact height less the negative adjustment value one time during the observation window and therefore a single TD count is registered. In FIG. 4B, the z-position measured for the chuck 102 rises above the contact height less the negative adjustment value and remains above this level until eventually dropping below the level toward the end of the observation window. The TD counter unit 118 also registers this event as a single TD for the wafer 104. As such, a single TD is registered for the wafer 104 for both observation windows shown in FIG. 4A and FIG. 4B.

In addition to detecting TD events for the wafer 104, the TD counter unit 118 also associates each TD with a location of the wafer 104 contacted by the probes 116 during that TD. In one embodiment, the TD counter unit 118 associates each of the TDs with an x-y wafer location of the die included in the region of the wafer 104 contacted by the probes 116 during that TD event.

Figure 5:
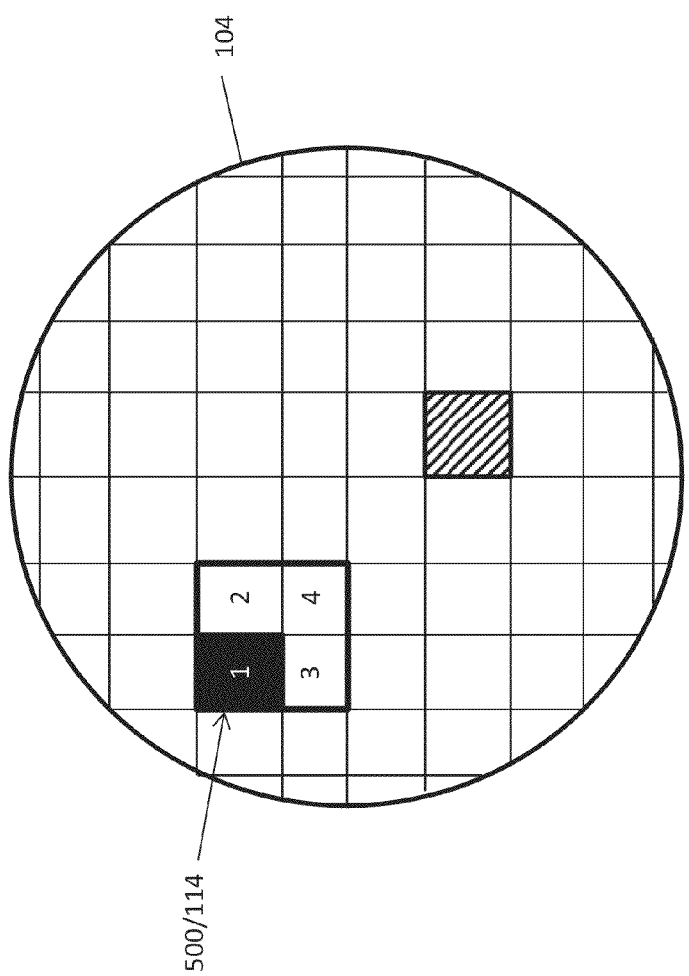
FIG. 5 illustrates a schematic diagram of an embodiment of recording x-y wafer location information for each touchdown event observed by a prober system.

FIG. 5 illustrates a schematic representation of the semiconductor wafer 104 overlaid with a grid 500 representing the probe card 114. As the chuck 102 moves into different positions under control of the processing circuit 108, a different region of the wafer 104 is aligned with the probe card 114. Each region of the wafer 104 includes a number of dies. For example in FIG. 5, the probe card 114 is a 2×2 probe card in that four dies (two rows of two dies and two columns of two dies) are tested in parallel. This is just one example. Other probe card configurations are within the scope of the embodiments described herein, and can include 2×3, 4×4, etc. Each time the chuck 102 is moved in the vertical direction into contact with the probes 116 of the probe card 114, the TD counter unit 118 registers a single TD event. The x-y wafer location of a die included in this region of the wafer 104 contacted by the probes 116 is associated with that TD event.

For example, the x-y wafer location for the upper leftmost die contacted by the probes 116 may be stored each time a TD is registered. This die has solid fill in FIG. 5 for the current position of the probe card 114. Based on the geometry of the probe card 114, it can be later determined which dies were contacted for each recorded TD. For example, if the x-y wafer location for the upper leftmost die contacted by the probes 116 is stored each time a TD is registered, and if the probe card 114 has a 2×2 geometry as shown in exemplary FIG. 5, it can be later determined which four dies were contacted for each registered TD based on the die x-y wafer location associated with each TD event (i.e. in this example, the die (1) with the recorded x-y coordinate, the die (2) immediately to the right of this die, and the die (3 and 4) immediately below each of these two dies).

Not all of dies on the same wafer 104 are necessarily contacted the same number of times. This depends on several variables such as the probe card geometry, die location on the wafer 104, the number of vertical chuck adjustments needed to ensure proper contact during test runs, etc. The methodology described above allows for later processing of the TD data collected by the prober system 100 in order to discern the total TD count for each individual die on the wafer 104. For example as shown in FIG. 5, the die with shading may have been contacted more than the dies in other regions of the wafer 104. By associating x-y or other type of wafer location information with each TD event, the individual dies contacted during each of the TD events can be determined based on the probe card geometry.

The prober system 100 also comprises data storage 110 for storing the total number of TDs determined by the processing circuit 108 and the wafer location associated with each of the TDs in a file. A purely exemplary file format is shown below with various logistical information, the TD count and wafer location information.

```
[LOGISTIC_INFORMATION]
WAFER_ID=ABC09876_42
PROBECARD_ID= M5010BGMC0101
SITE_POSITION= 1,4 (coordinates of Site 0)
X_INCREASE_DIRECTION= rightward (direction of x-coordinate increasing)
Y_INCREASE_DIRECTION= forward (direction of x-coordinate increasing)
SITEMASK_INFO=
    sitemask:        70
    sitemask_int:    70
    max_x:           4
    max_y:           4
    site_count:      16
    line_1:          0 1 2 3
    line_2:          4 5 6 7
    line_3:          8 9 10 11
    line_4:          12 13 14 15
START=2012-02-29_13:35:42
END=2012-03-01_02:41:01
...
[WAFER_VALUES]
UNLOCATABLE_TDC=3
[DIE_VALUES_LT]
X8Y32
X8Y33
X8Y34
X8Y35
X8Y36
X8Y37
X8Y38
X8Y39
X9Y11
X9Y12
X9Y12
...
    [FILEEND]
```

[LOGISTIC_INFORMATION] contains information about the wafer 104 for which the counted TDs belong. WAFER_ID identifies the wafer 104 or can be empty if unknown. START is the time at which the wafer 104 is loaded on the chuck 102. END is the time at which the wafer 104 is unloaded from the chuck 102. SITE_POSITION, X/Y_INCREASE_DIRECTION and SITEMASK_INFO allow the identification of which dies will be contacted during each TD. This includes geometry information for the prober system 100. The geometry information indicates the number of rows and columns of dies positioned by the prober system 100 for parallel testing. PROBECARD_ID is the identification ID of the probe card 114 and can be used for counting all TDs by the probe card 114 during its lifetime. WAFER_VALUES contains the values counted for the entire wafer 104 which are not locatable. The locatable TDs are stored in the section DIE_VALUES_LT. For each TD, the coordinates e.g. of the first die are stored in the logistics file. If a TD is repeated for some reason, the entry for this first die is repeated for as many times the TD occurs. In the example given above, the coordinates for the die located at X9, Y12 are repeated twice to indicate two different TD events for this starting x-y wafer location. The file has a marker FILEEND for detecting the correct closing of a file and for identifying incomplete or corrupt files. SITEMASK_INFO provides information about the structure of one TD. It is stored in a so-called site mask configuration file and can be read by the prober system 100. For example:

| SITEMASK_INFO= | |
|---|---|
| site mask: | 70 |
| sitemask_int: | 70 |
| max_x: | 4 |
| max_y: | 4 |

-continued

| SITEMASK_INFO= | |
| --- | --- |
| site_count: | 16 |
| line_1: | 0 1 2 3 |
| line_2: | 4 5 6 7 |
| line_3: | 8 9 10 11 |
| line_4: | 12 13 14 15 | where 'site mask: 70' indicates a 16-fold test with a 4×4 structure where site 0 is the top left position, x-direction is left-to-right with a row of 4 contacted dies, and y-direction is top-down with a column of 4 contacted dies so that line 1 of the probe card 114 corresponds to dies 0, 1, 2 and 3, line 2 of the probe card 114 corresponds to dies 4, 5, 6 and 7, etc. The processing circuit 108 can integrate this information into a logistics file with the other prober and TD count information.

For detecting TDs and assigning them to wafers, it is irrelevant whether a wafer test run is started by an IT system. A wafer can only be contacted between loading and unloading. As such the start and finalization of a new logistics file are triggered by wafer load and wafer unload events, respectively.

Figure 6:
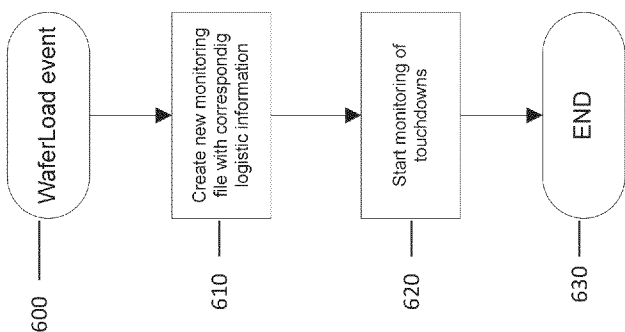
FIG. 6 illustrates a flow diagram of an embodiment of a wafer load event at a prober system equipped to count wafer touchdowns.

FIG. 6 illustrates an embodiment of a wafer load event. After a wafer load event is detected (Step 600), the processing circuit 108 of the prober system 100 creates a new logistics (monitoring) file with corresponding logistic information for the wafer 104 being probed (Step 610) e.g. of the kind previously described herein. The processing circuit 108 monitors for TD events (Step 620) e.g. in accordance with FIG. 2 previously described herein. The processing circuit 108 can end the TD monitoring in response to various events (Step 630).

Figure 7:
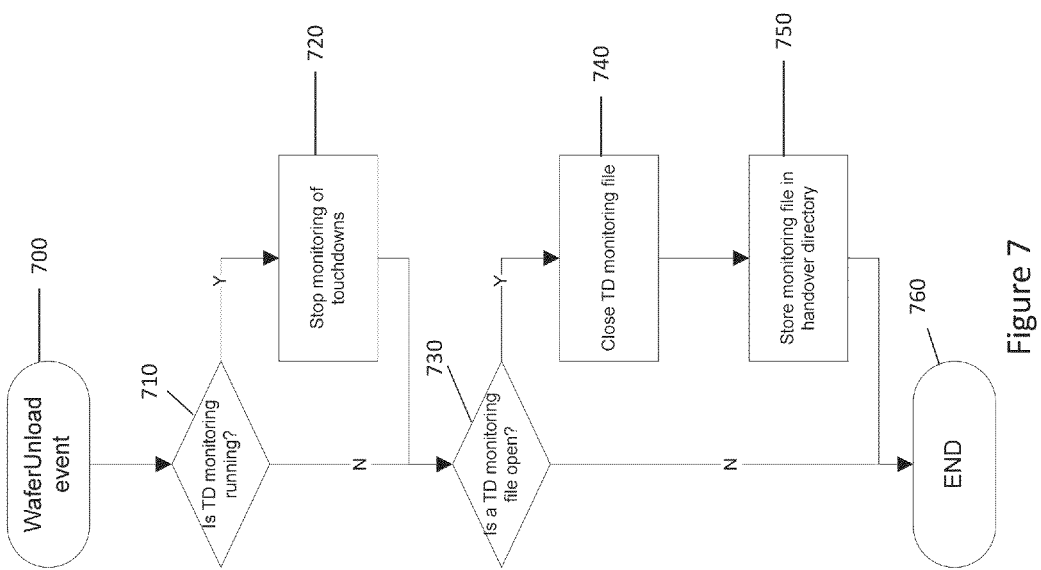
FIG. 7 illustrates a flow diagram of an embodiment of a wafer unload event at a prober system equipped to count wafer touchdowns.

FIG. 7 illustrates an embodiment of a wafer unload event. After a wafer unload event is detected (Step 700), the processing circuit 108 of the prober system 100 determines whether a TD monitoring process is in progress (Step 710). If so, the TD monitoring process is stopped (Step 720). The processing circuit 118 then determines whether a TD monitoring logistics file is open (Step 730). If so, the file is closed (Step 740) and the closed logistics file is stored in the data storage 110 of the prober system 100 (Step 750). The wafer unload event then terminates (Step 760). The logistics files stored by various prober systems as well as corresponding wafer test data stored at test systems are available for local or remote retrieval and analysis.

Figure 8:
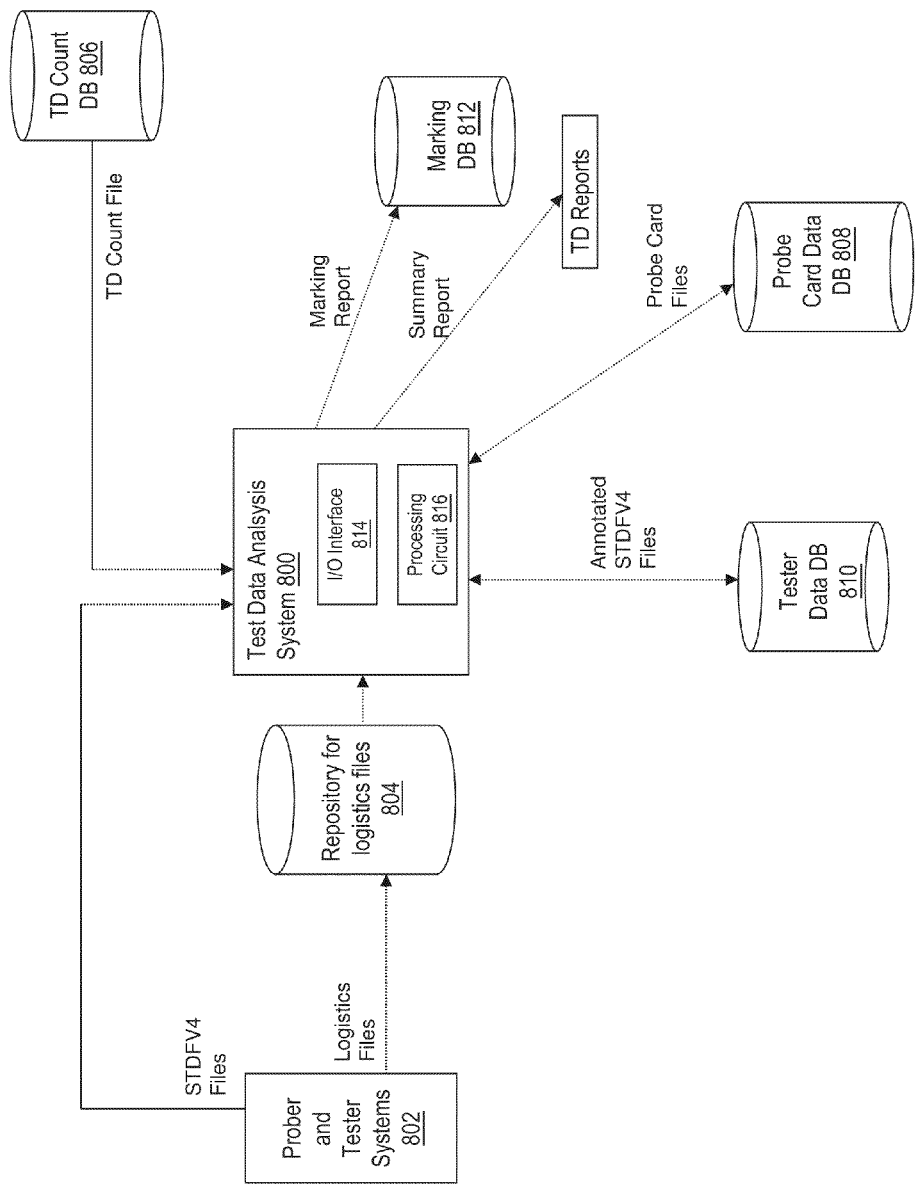
FIG. 8 illustrates a schematic block diagram of an embodiment of a test data analysis system for analyzing wafer touchdown information.
Figure 9:
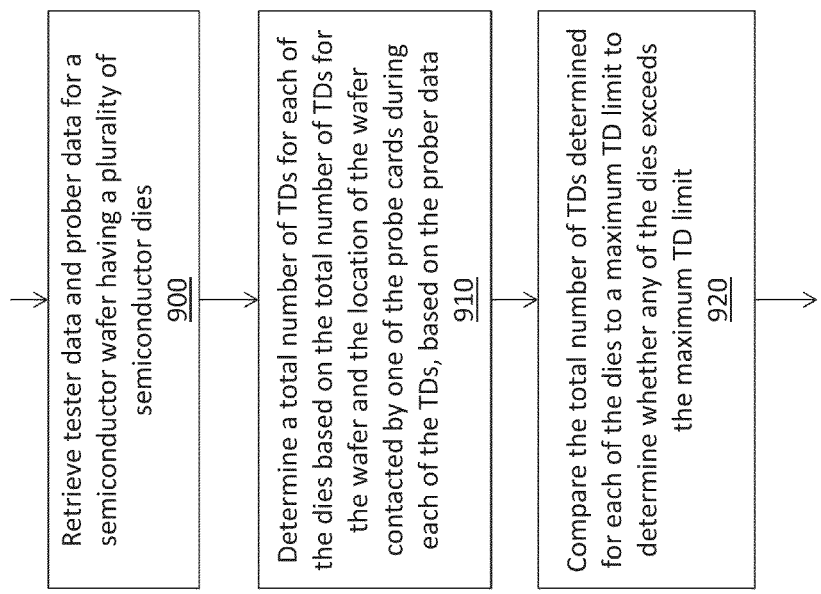
FIG. 9 illustrates a flow diagram of an embodiment of a method of analyzing test data by the test data analysis system of FIG. 8.

FIG. 8 illustrates an embodiment of a test data analysis system 800 which analyses the logistics files and the tester files to, among other things, determine TD count information for individual dies and determine whether any of the dies exceed a TD count limit based on the per-die TD count information. Operation of the test data analysis system 800 is explained next with reference to FIG. 9, which illustrates an embodiment of a method of analyzing test data. The prober systems 100 which generate the logistics files previously described herein and the test systems 112 which generate corresponding test data are schematically illustrated as a single block 802 in FIG. 8 for ease of illustration.

The logistics files generated by the various prober systems 100 are stored in a repository 804 to which the test data analysis system 800 has access. The test data analysis system 800 also has access to several other databases 806, 808, 810, 812. These databases/repositories 804-812 can be physically separate storage systems located at the same or different geographic sites, or can be a single storage system that stores all data accessed by the test data analysis system 800.

In each case, the test data analysis system 800 includes a standard input/output (I/O) interface 814 for retrieving and/or writing data to/from the various databases/repositories 804-812. The test data analysis system 800 also includes a processing circuit 816 for analyzing the prober and test data, modifying data and generating reports. The processing circuit 816 can include digital and/or analog circuitry such as one or more controllers, processors, ASICs (application-specific integrated circuits), etc. for executing program code which performs the test data analysis operations described herein.

The I/O interface 814 of the test data analysis system 800 retrieves tester data and prober data for a semiconductor wafer 104 of interest (Step 900). The tester data includes test data collected for the wafer by one or more testers 112 having a probe card 114 for contacting the wafer 104. The test data can be in any standard form such as STDFV4 (standard test data format version 4). The prober data includes the total number of TDs between the wafer 104 and each probe card 114 that tested the wafer 104, and a location of the wafer 104 contacted by one of the probe cards 114 during each of the TDs. For example, the prober data can be in the logistics file format previously described herein.

The processing circuit 816 of the test data analysis system 800 determines the total number of TDs for each of the dies on the wafer 104 based on the total number of TDs for the wafer 104 and the location of the wafer 104 contacted by one of the probe cards 114 during each of the TDs (Step 910). This information analyzed by the processing circuit 816 is extracted from the prober data. In one embodiment, the location of the wafer 104 contacted by one of the probe cards 114 during each of the TDs corresponds to the x-y wafer location of the die included in the region of the wafer 104 contacted by the probe card 114 during that touchdown e.g. as previously described herein with reference to FIG. 5. According to this embodiment, the prober data further includes geometry information for each prober system 100 that handled the wafer 104. The geometry information indicates the number of rows and columns of dies positioned by each prober system 100 for parallel testing.

For each TD indicated by the prober data, the processing circuit 816 of the test data analysis system 800 overlays the x-y wafer location information associated with that TD with the geometry information for the prober system 100 that handled the wafer 104 during that TD to determine which of the dies were contacted during that TD. Returning to the 2×2 probe card geometry example previously given herein, the processing circuit 816 assigns a single TD count to the die having the x-y wafer location associated with that TD event (e.g. die 1 in FIG. 5). The processing circuit 816 also assigns a single TD count to the die immediately to the right of this die (e.g. die 2 in FIG. 5) and to the die immediately below each of these two dies (e.g. dies 3 and 4 in FIG. 5).

After determining the total TD counts for all of the dies, the processing circuit 116 of the test data analysis system 800 then compares the total number of TDs determined for each of the dies to a maximum TD limit to determine whether any of the dies exceeds the maximum TD limit (Step 920). In one embodiment, the I/O interface 814 of the test data analysis system 800 retrieves the maximum TD limit information from a corresponding database 806.

The I/O interface 814 can also retrieve prober touchdown count data from another database 808. The prober touchdown count data indicates the TD count information for each of the probe cards 114 that contacted the wafer 104 of interest. The processing circuit 816 of the test data analysis system 800 can update the prober touchdown count data based on the prober data retrieved for the wafer 104, so that the updated prober touchdown count data accounts for the number of TDs performed by each of the probe cards 114 that contacted the wafer 104. This way, probe cards 114 which exceed a certain TD count limit can be removed and inspected for damage.

In one embodiment, the tester data retrieved by the I/O interface 814 for the wafer 104 of interest is included in an STDF file. The receipt of the STDF file by the I/O interface 814 can trigger the processing circuit 816 of the test data analysis system 800 to begin analysis of the prober data for the wafer 104 of interest, to determine whether any of the dies exceeds the maximum TD limit as explained above. The processing circuit 816 can add the total number of TDs previously determined for each of the dies to the STDF file. The I/O interface 814 can write the annotated STDF file to a tester data database 810 which stores the tester data.

The processing circuit 816 of the test data analysis system 800 can also generate different reports based on the per-die TD count information generated by the processing circuit 816. In one embodiment, the processing circuit 816 generates a report indicating which of the dies exceed the maximum TD limit. This report is useful for marking of the dies, to indicate which dies exceed the maximum TD limit. The I/O interface 814 can store this report in a die marking database 812 for later use in marking of the dies. In another embodiment, the processing circuit 816 generates a report indicating the total number of TDs for each of the dies. Such a report may be useful to a contractor or other third party who performs post-processing on known good dies. If additional contact to the pads of the dies is required as part of this post-processing, the third party is aware of how many additional TDs are permitted before exceeding the maximum TD limit for the dies by examining the TD count information contained in this report.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A prober system, comprising:
a chuck configured to horizontally move a semiconductor wafer having a plurality of semiconductor dies to position a selected group of the dies for parallel testing and vertically move the wafer to press the selected group of dies in contact with probes of a tester probe card;
a sensor configured to measure the vertical movement of the chuck when the wafer is on the chuck;
a processing circuit configured to:
control the horizontal and vertical movement of the chuck to test different groups of the dies;
determine a total number of touchdowns between the wafer and the probes based on the vertical movement of the chuck measured by the sensor; and
associate each of the touchdowns with a location of the wafer contacted by the probes during that touchdown.

2. The prober system of claim 1, wherein the processing circuit is configured to:
compare vertical movement measurement data from the sensor for the chuck to a threshold value, the threshold value corresponding to a contact height value assigned to the probes plus an adjustment value which accounts for height differences between the probes; and
determine a touchdown occurred between the wafer and the probes each time the vertical movement measurement data exceeds the threshold value.

3. The prober system of claim 2, wherein the adjustment value ranges between −99 μm and +99 μm.

4. The prober system of claim 1, wherein the processing circuit is configured to associate each of the touchdowns with an x-y wafer location of a die included in a region of the wafer contacted by the probes during that touchdown.

5. The prober system of claim 1, further comprising data storage configured to store the total number of touchdowns determined by the processing circuit and the wafer location associated with each of the touchdowns in a file.

6. The prober system of claim 5, wherein the processing circuit is further configured to write geometry information for the prober system into the file, the geometry information indicating a number of rows and columns of dies positioned by the prober system for parallel testing.

7. A method of counting wafer touchdowns at a prober system, the method comprising:
loading a semiconductor wafer having a plurality of semiconductor dies onto a chuck of the prober system;
controlling horizontal movement of the chuck to position a selected group of the dies for parallel testing and vertical movement of the chuck to press the selected group of dies in contact with probes of a tester probe card;
measuring the vertical movement of the chuck when the wafer is on the chuck;
determining a total number of touchdowns between the wafer and the probes based on the vertical movement measured for the chuck; and
associating each of the touchdowns with a location of the wafer contacted by the probes during that touchdown.

8. The method of claim 7, wherein determining the total number of touchdowns between the wafer and the probes comprises:
comparing vertical movement measurement data for the chuck to a threshold value, the threshold value corresponding to a contact height value assigned to the probes plus an adjustment value which accounts for height differences between the probes; and
determining a touchdown occurred between the wafer and the probes each time the vertical movement measurement data exceeds the threshold value.

9. The method of claim 7, wherein associating each of the touchdowns with a location of the wafer contacted by the probes during that touchdown comprises associating each of the touchdowns with an x-y wafer location of a die included in a region of the wafer contacted by the probes during that touchdown.

10. The method of claim 7, further comprising storing the total number of touchdowns determined by the processing circuit and the wafer location associated with each of the touchdowns in a file.

11. The method of claim 10, further comprising writing geometry information for the prober system into the file, the geometry information indicating a number of rows and columns of dies positioned by the prober system for parallel testing.

12. A test data analysis system, comprising:
an input/output (I/O) interface configured to retrieve tester data and prober data for a semiconductor wafer having a plurality of semiconductor dies, the tester data including test data collected for the wafer by one or more testers having a probe card for contacting the wafer, the prober data including a total number of touchdowns between the wafer and each probe card that tested the wafer and a location of the wafer contacted by one of the probe cards during each of the touchdowns; and
a processing circuit configured to:
determine a total number of touchdowns for each of the dies based on the total number of touchdowns for the wafer and the location of the wafer contacted by one of the probe cards during each of the touchdowns; and
compare the total number of touchdowns determined for each of the dies to a maximum touchdown limit to determine whether any of the dies exceeds the maximum touchdown limit.

13. The test data analysis system of claim 12, wherein the location of the wafer contacted by one of the probe cards during each of the touchdowns corresponds to an x-y wafer location of a die included in a region of the wafer contacted by the probe card during that touchdown.

14. The test data analysis system of claim 13, wherein the prober data further includes geometry information for each prober system that handled the wafer, the geometry information indicating a number of rows and columns of dies positioned by each prober system for parallel testing, and wherein for each of the touchdowns of the wafer the processing circuit is configured to overlay the x-y wafer location information associated with that touchdown with the geometry information for the prober system that handled the wafer during that touchdown to determine which of the dies were contacted during that touchdown.

15. The test data analysis system of claim 12, wherein the I/O interface is further configured to retrieve prober touchdown count data indicating touchdown count information for each of the probe cards that contacted the wafer, and wherein the processing circuit is further configured to update the prober touchdown count data based on the prober data retrieved for the wafer so that the updated prober touchdown count data accounts for the number of touchdowns performed by each of the probe cards that contacted the wafer.

16. The test data analysis system of claim 12, wherein tester data for the wafer is included in a STDF file, and wherein receipt of the STDF file by the I/O interface triggers the processing circuit to begin analysis of the prober data for the wafer to determine whether any of the dies exceeds the maximum touchdown limit.

17. The test data analysis system of claim 16, wherein the processing circuit is further configured to add the total number of touchdowns for each of the dies to the STDF file.

18. The test data analysis system of claim 12, wherein the processing circuit is further configured to generate at least one of a first report indicating which of the dies failed the maximum touchdown limit and a second report indicating the total number of touchdowns for each of the dies.

19. A method of analyzing test data, the method comprising:
retrieving tester data and prober data for a semiconductor wafer having a plurality of semiconductor dies, the tester data including test data collected for the wafer by one or more testers having a probe card for contacting the wafer, the prober data including a total number of touchdowns between the wafer and each probe card that tested the wafer and a location of the wafer contacted by one of the probe cards during each of the touchdowns;
determining a total number of touchdowns for each of the dies based on the total number of touchdowns for the wafer and the location of the wafer contacted by one of the probe cards during each of the touchdowns; and
comparing the total number of touchdowns determined for each of the dies to a maximum touchdown limit to determine whether any of the dies exceeds the maximum touchdown limit.

20. The method of claim 19, wherein the location of the wafer contacted by one of the probe cards during each of the touchdowns corresponds to an x-y wafer location of a die included in a region of the wafer contacted by the probe card during that touchdown.

21. The method of claim 20, wherein the prober data further includes geometry information for each prober system that handled the wafer, the geometry information indicating a number of rows and columns of dies positioned by each prober system for parallel testing, the method further comprising:
for each of the touchdowns of the wafer, overlaying the x-y wafer location information associated with that touchdown with the geometry information for the prober system that handled the wafer during that touchdown to determine which of the dies were contacted during that touchdown.

22. The method of claim 19, further comprising:
retrieving prober touchdown count data indicating touchdown count information for each of the probe cards that contacted the wafer; and
updating the prober touchdown count data based on the prober data retrieved for the wafer so that the updated prober touchdown count data accounts for the number of touchdowns performed by each of the probe cards that contacted the wafer.

23. The method of claim 19, wherein the tester data for the wafer is included in a STDF file, the method further comprising:
beginning analysis of the prober data for the wafer to determine whether any of the dies exceeds the maximum touchdown limit responsive to receipt of the STDF file.

24. The method of claim 23, further comprising:
adding the total number of touchdowns for each of the dies to the STDF file.

25. The method of claim 19, further comprising:
generating at least one of a first report indicating which of the dies failed the maximum touchdown limit and a second report indicating the total number of touchdowns for each of the dies.

* * * * *